(12) United States Patent
Kawasaki

(10) Patent No.: US 11,139,795 B2
(45) Date of Patent: Oct. 5, 2021

(54) ELECTRONIC COMPONENT AND MODULE INCLUDING THE SAME

(71) Applicant: Murata Manufacturing Co., Ltd., Nagaokakyo (JP)

(72) Inventor: Koichiro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 66 days.

(21) Appl. No.: 16/656,705

(22) Filed: Oct. 18, 2019

(65) Prior Publication Data

US 2020/0052676 A1 Feb. 13, 2020

Related U.S. Application Data

(63) Continuation of application No. PCT/JP2018/014834, filed on Apr. 9, 2018.

(30) Foreign Application Priority Data

Apr. 25, 2017 (JP) .............................. JP2017-086249

(51) Int. Cl.
*H03H 9/10* (2006.01)
*H03H 9/05* (2006.01)
(Continued)

(52) U.S. Cl.
CPC ......... *H03H 9/1092* (2013.01); *B81B 7/0041* (2013.01); *H03H 3/08* (2013.01);
(Continued)

(58) Field of Classification Search
CPC ........ H03H 9/1092; H03H 3/08; H03H 9/059; H03H 9/25; B81B 7/0041;
(Continued)

(56) References Cited

U.S. PATENT DOCUMENTS 7,427,824 B2 * 9/2008 Iwamoto .............. H03H 9/0576
310/313 R
2004/0145278 A1 7/2004 Iwamoto
(Continued)

FOREIGN PATENT DOCUMENTS

JP 2004-248243 A 9/2004
JP 2006-202918 A 8/2006
(Continued)

OTHER PUBLICATIONS

Official Communication issued in International Patent Application No. PCT/JP2018/014834, dated Jun. 19, 2018.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An electronic component includes a piezoelectric substrate, a first functional element, a first wiring, insulating films, a first conductive film, and a first external connection terminal. The first functional element is disposed on the piezoelectric substrate. The first wiring is disposed on the piezoelectric substrate, and is electrically connected to the first functional element. The insulating films are disposed on the piezoelectric substrate, and define a first hollow portion in which the first functional element is included. The first conductive film is disposed on the insulating films, and has a portion that passes through the insulating films and is electrically connected to the first wiring. The first external connection terminal is provided on the first conductive film, and is disposed at a position overlapping at least a portion of the first functional element in a plan view as viewed in the thickness direction of the piezoelectric substrate.

16 Claims, 8 Drawing Sheets

(51) Int. Cl.
*H03H 9/25* (2006.01)
*B81B 7/00* (2006.01)
*H03H 3/08* (2006.01)

(52) U.S. Cl.
CPC .............. *H03H 9/059* (2013.01); *H03H 9/25* (2013.01); *B81C 2203/0136* (2013.01); *B81C 2203/0145* (2013.01); *B81C 2203/0163* (2013.01)

(58) Field of Classification Search
CPC .... B81C 2203/0136; B81C 2203/0145; B81C 2203/0163
USPC ................ 333/133, 186, 187, 188, 193–196
See application file for complete search history.

(56) References Cited

U.S. PATENT DOCUMENTS

| | | |
|---|---|---|
| 2009/0201102 A1 | 8/2009 | Oda |
| 2011/0018389 A1 | 1/2011 | Fukano et al. |
| 2014/0132368 A1 | 5/2014 | Tsuda |
| 2016/0016790 A1 | 1/2016 | Marksteiner |

FOREIGN PATENT DOCUMENTS

| | | |
|---|---|---|
| JP | 2007-189501 A | 7/2007 |
| JP | 2014-120966 A | 6/2014 |
| JP | 2016-516325 A | 6/2016 |
| WO | 2008/059674 A1 | 5/2008 |
| WO | 2009/096563 A1 | 8/2009 |

\* cited by examiner

ELECTRONIC COMPONENT AND MODULE INCLUDING THE SAME

CROSS REFERENCE TO RELATED APPLICATIONS

This application claims the benefit of priority to Japanese Patent Application No. 2017-086249 filed Apr. 25, 2017 and is a Continuation Application of PCT Application No. PCT/JP2018/014834 filed on Apr. 9, 2018. The entire contents of each application are hereby incorporated herein by reference.

BACKGROUND OF THE INVENTION

1. Field of the Invention

The present invention relates to an electronic component and a module including the same, and more particularly, to an electronic component that is flip-chip mounted on a circuit board, and a module including the same.

2. Description of the Related Art

In order to miniaturize an electronic component mounted on a radio frequency (RF) circuit in a communication device such as a cellular phone, for example, Japanese Unexamined Patent Application Publication (Translation of PCT Application) No. 2016-516325 discloses an electronic component encapsulated by covering a functional structure formed on a substrate (for example, a micro electro mechanical system (MEMS) structure or a filter operating by sound waves) with a thin film cover.

In the electronic component described in Japanese Unexamined Patent Application Publication (Translation of PCT Application) No. 2016-516325, a functional structure and a conducting wire are formed on a main surface of a support substrate, and bumps serving as external connection terminals are mounted on the conducting wire. In a plan view seen from a thickness direction of the support substrate, the functional structure and the bumps are arranged side by side.

When a rapid temperature change (referred to as heat shock) occurs at a bonding portion between the bump and the conducting wire, there is a risk that a crack may occur in the bonding portion. In order to prevent the occurrence of cracks in the bonding portion due to heat shock, it is necessary to increase the adhesion between the bump and the conducting wire, and so it is necessary to enlarge an area of the conducting wire on which the bump is placed on the main surface of the support substrate. On the other hand, when the area occupied by the conducting wire on the main surface of the support substrate is increased, an area in which the functional structure is disposed over the entire main surface is narrowed, which leads to deterioration in performance of the electronic component, and it cannot be reduced in size. In other words, in the electronic component having a plurality of functional structures, there is a trade-off between the area of the conducting wire on which the bump is placed and the area on which the functional structure is disposed, and it is difficult to reduce the size of the electronic component while securing the heat shock resistivity.

SUMMARY OF THE INVENTION

Preferred embodiments of the present invention provide electronic components that are each able to provide both miniaturization and securing of heat shock resistivity, and modules including the electronic components.

An electronic component according to a preferred embodiment of the present invention includes a piezoelectric substrate, a first functional element, a first wiring, an insulating film, a first conductive film, and a first external connection terminal. The first functional element is provided on the piezoelectric substrate. The first wiring is provided on the piezoelectric substrate, and is electrically connected to the first functional element. The insulating film is provided on the piezoelectric substrate to define a first hollow portion in which the first functional element is included. The first conductive film is provided on the insulating film, and has a portion that passes through the insulating film and is electrically connected to the first wiring. The first external connection terminal is provided on the first conductive film and is located at a position overlapping at least a portion of the first functional element in a plan view as viewed from a thickness direction of the piezoelectric substrate.

Preferably, in the insulating film, a first hole portion is provided that opens toward the first hollow portion. The first conductive film is located at a position overlapping the first hole portion in a plan view.

Preferably, the insulating film includes a first cover that defines the first hollow portion and a second cover that covers the first cover. The first hole portion is provided in the first cover and is located at a position overlapping the second cover and the first conductive film in a plan view.

Preferably, the electronic component further includes a second functional element, a second wiring, a second conductive film, and a second external connection terminal. The second functional element is provided on the piezoelectric substrate and is electrically connected in series with the first functional element. The second wiring is provided on the piezoelectric substrate and is connected between the first functional element and the second functional element. The insulating film further defines a second hollow portion in which the second functional element is disposed. The second conductive film is provided on the insulating film, and is electrically isolated from the second wiring. The second external connection terminal is provided on the second conductive film, and is located at a position overlapping at least a portion of the second wiring in a plan view.

Preferably, the second conductive film is located at a position overlapping at least a portion of the second wiring and the second functional element in a plan view.

Preferably, the insulating film includes first and second hole portions that open toward the first and second hollow portions, respectively. The first conductive film is located at a position overlapping the first hole portion in a plan view. The second conductive film is located at a position overlapping the second hole portion in a plan view.

Preferably, the insulating film includes a first cover that defines the first and second hollow portions and a second cover that covers the first cover. The first hole portion is provided in the first cover and is located at a position overlapping the second cover and the first conductive film in a plan view. The second hole portion is provided in the first cover, and is located at a position overlapping the second cover and the second conductive film in a plan view.

A module according to a preferred embodiment of the present invention includes a circuit board including a wiring provided on at least a surface thereof, and an electronic component according to a preferred embodiment of the present invention flip-chip mounted on the circuit board.

Preferably, the module further includes a sealing material provided on the circuit board and sealing the electronic component.

According to the electronic components and the modules in the preferred embodiments of the present invention, it is possible to obtain both miniaturization and heat shock resistivity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the accompanying drawings. The same or corresponding portions are denoted by the same reference signs, and description thereof will not be repeated.

In the preferred embodiments described below, when reference is made to the number, the amount, and the like, the scope of the present invention is not necessarily limited to the number, the amount, and the like, except for a case where there is a particular description. Moreover, in the following preferred embodiments, each component is not essential or critical to the present invention, unless otherwise specified.

First Preferred Embodiment

An electronic component 1 according to a first preferred embodiment of the present invention is applied to, for example, an RF circuit in a communication device, such as a cellular phone, for example. The electronic component 1 operates by acoustic waves, and preferably includes, for example, a surface acoustic wave (SAW) component, a bulk acoustic wave (BAW) component, a MEMS component, and the like. In the present preferred embodiment, a surface acoustic wave filter is exemplified as one preferred embodiment of the electronic component 1. Hereinafter, the electronic component 1 is also referred to as a "surface acoustic wave filter 1".

Surface Acoustic Wave Filter

Figure 1:
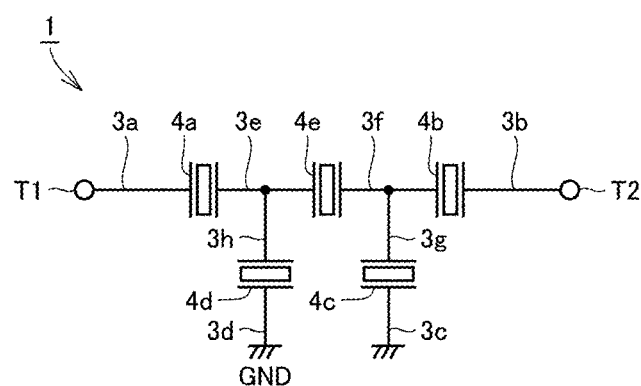
FIG. 1 is a diagram showing circuitry of a surface acoustic wave filter according to a first preferred embodiment of the present invention.

FIG. 1 is a diagram showing circuitry of the surface acoustic wave filter 1 according to the first preferred embodiment of the present invention.

Referring to FIG. 1, the surface acoustic wave filter 1 according to the first preferred embodiment includes an input terminal T1, an output terminal T2, series arm resonators 4a, 4b, and 4e, parallel arm resonators 4c and 4d, and wirings 3a to 3f. The surface acoustic wave filter 1 filters a signal input to the input terminal T1 and output the filtered signal to the output terminal T2.

The surface acoustic wave filter 1 is preferably a ladder filter in which a plurality of surface acoustic wave resonators are connected to each other in a ladder topology. Specifically, the series arm resonators 4a, 4e, and 4b are connected in series between the input terminal T1 and the output terminal T2. One terminal of the series arm resonator 4a is connected to the input terminal T1 via the wiring 3a, and the other terminal thereof is connected to one terminal of the series arm resonator 4e via the wiring 3e. The other terminal of the series arm resonator 4e is connected to one terminal of the series arm resonator 4b via the wiring 3f. The other terminal of the series arm resonator 4b is connected to the output terminal T2 via the wiring 3b.

In the parallel arm resonator 4d, one terminal is connected to a connection node of the series arm resonators 4a and 4e via a wiring 3h, and the other terminal is connected to a ground wiring GND via the wiring 3d. One terminal of the parallel arm resonator 4c is connected to a connection node of the series arm resonators 4e and 4b via a wiring 3g, and the other terminal thereof is connected to the ground wiring GND via the wiring 3c.

Each of the series arm resonators 4a, 4b, and 4e and the parallel arm resonators 4c and 4d is preferably defined by a one-port surface acoustic wave resonator. The surface acoustic wave resonator corresponds to one preferred embodiment of the "functional element".

Figure 2:
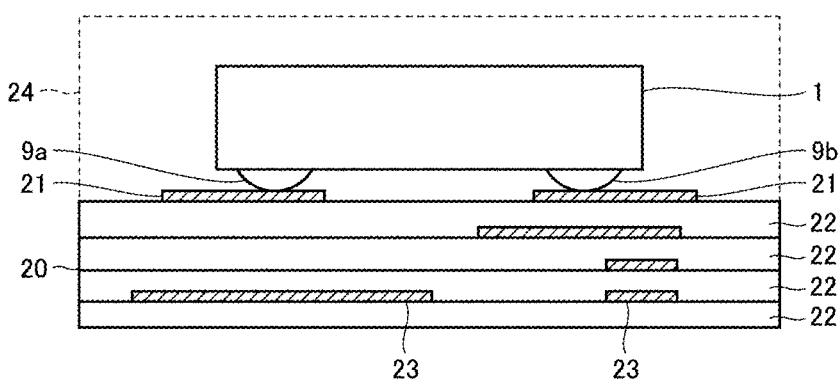
FIG. 2 is a cross-sectional view showing an example of a state in which a surface acoustic wave filter is mounted in or on a circuit board.

FIG. 2 is a cross-sectional view showing an example of a state in which the surface acoustic wave filter 1 is mounted in or on a circuit board 20.

As shown in FIG. 2, the surface acoustic wave filter 1 is mounted in or on the circuit board 20 by being sealed by a resin 24 in a state in which bumps 9a and 9b are brought into contact with a wiring 21 provided on the circuit board 20. That is, the surface acoustic wave filter 1 is flip-chip mounted on the circuit board 20.

The circuit board 20 includes a multilayer body of a plurality of dielectric layers 22 and a plurality of electrode layers 23. Each of the plurality of dielectric layers 22 may preferably be made of, for example, a resin, a ceramic such as alumina ($Al_2O_3$), or the like. That is, the circuit board 20 may be a printed wiring multilayer substrate made of a resin or a ceramic multilayer substrate.

The surface acoustic wave filter 1, the circuit board 20, and the resin 24 define a "module". In the first preferred embodiment, the module is preferably a chip size package (CSP) surface acoustic wave filter.

Next, the surface acoustic wave filter 1 according to the first preferred embodiment will be described with reference to FIG. 3 to FIG. 5.

Figure 3:
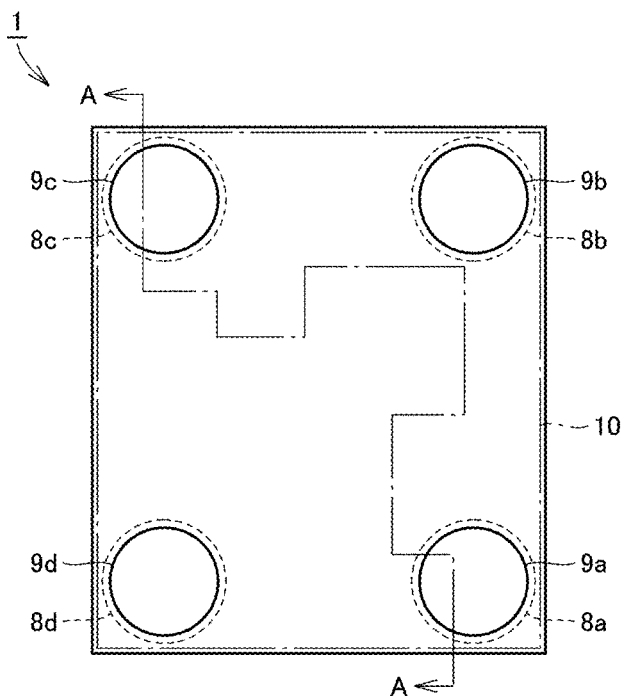
FIG. 3 is a plan view of the surface acoustic wave filter shown in FIG. 2.

FIG. 3 is a plan view of the surface acoustic wave filter shown in FIG. 2. FIG. 4 is a perspective plan view of the surface acoustic wave filter 1 shown in FIG. 2. The surface acoustic wave resonators 4a to 4e and the wirings 3a to 3f incorporated in the surface acoustic wave filter 1 are covered with a sealing material 10 and an insulating film, but FIG. 4 shows an internal structure by seeing through the sealing material 10 and the insulating film for convenience of explanation. FIG. 5 is a cross-sectional view corresponding to a portion along a line A-A in FIG. 3.

Figure 4:
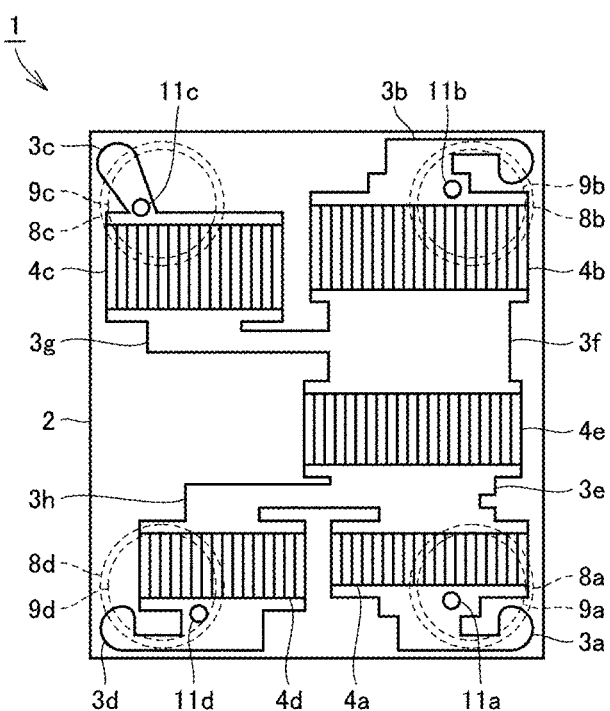
FIG. 4 is a perspective plan view of the surface acoustic wave filter shown in FIG. 2.
Figure 5:
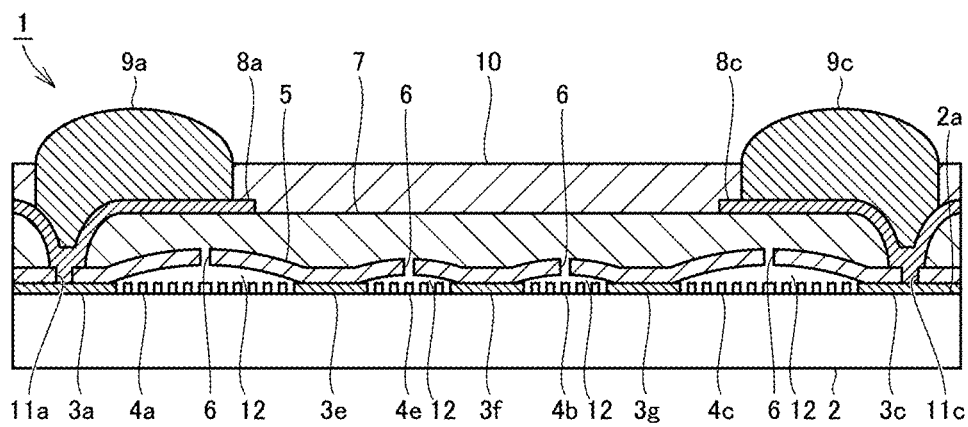
FIG. 5 is a cross-sectional view corresponding to a portion along a line A-A in FIG. 3.

Referring to FIG. 3 to FIG. 5, the surface acoustic wave filter 1 includes a piezoelectric substrate 2, surface acoustic wave resonators 4a to 4e, wirings 3a to 3f, a cover film 5, a reinforcing film 7, conductive films 8a to 8d, the bumps 9a to 9d, and the sealing material 10. In the following, when the surface acoustic wave resonators 4a to 4e are comprehensively represented, it is also simply referred to as "surface acoustic wave resonator 4", and when the wirings 3a to 3f are comprehensively represented, it is also simply referred to as "wiring 3". In addition, when the conductive films 8a to 8d are comprehensively represented, it is also simply referred to as "conductive film 8", and when the bumps 9a to 9d are comprehensively represented, it is also simply referred to as "bump 9".

The piezoelectric substrate 2 is preferably made of, for example, a piezoelectric crystal substrate such as lithium tantalate ($LiTaO_3$) or lithium niobate ($LiNbO_3$). The piezoelectric substrate 2 may include a piezoelectric ceramic or a substrate including a piezoelectric thin film provided on a main surface thereof. The piezoelectric substrate 2 preferably has, for example, a rectangular parallelepiped shape or a substantially rectangular parallelepiped shape, and has a rectangular or substantially rectangular shape in a plan view as viewed from a thickness direction of the piezoelectric substrate 2. The piezoelectric substrate 2 has a main surface 2a. The main surface 2a refers to a main surface opposed to the circuit board 20 (see FIG. 2) of the two main surfaces of the piezoelectric substrate 2.

The surface acoustic wave resonator 4 and the wiring 3 are disposed on the main surface 2a of the piezoelectric substrate 2. The surface acoustic wave resonator 4 is preferably made of, for example, a conductor layer such as aluminum (Al), copper (Cu), nickel (Ni), gold (Au), platinum (Pt), or the like provided on the main surface 2a, and includes a pair of comb-shaped electrodes (hereinafter, also referred to as "interdigital transducer (IDT) electrodes"). The surface acoustic wave resonator 4 may further include two reflectors disposed on both sides in a propagation direction of the surface acoustic wave with respect to the IDT electrode.

The ladder filter shown in FIG. 1 includes a plurality of surface acoustic wave resonators 4a to 4e. The size of each of the surface acoustic wave resonators 4a to 4e is set so that the ladder filter has a predetermined transmission characteristic. Since the features and operation of the surface acoustic wave resonators 4a to 4e are the same as or similar to those of the general surface acoustic wave resonator, detailed description thereof will be omitted.

The wiring 3 includes a conductor layer preferably made of, for example, Al, Cu, Ni, Au, Pt or the like formed on a main surface 2a, and at least one end thereof is connected to one comb-shaped electrode of the surface acoustic wave resonator.

As shown in FIG. 5, the cover film 5 is disposed on the piezoelectric substrate 2 and is opposed to the main surface 2a. The cover film 5 is preferably made of, for example, an insulating material, and for example, silicon oxide ($SiO_2$), silicon nitride ($Si_xN_y$), $Al_2O_3$, or the like can be used. The cover film 5 preferably has the same or substantially the same rectangular shape as that of the main surface 2a. The cover film 5 preferably has a thickness of, for example, about 3 μm. The cover film 5 defines a hollow portion 12 in which the surface acoustic wave resonator 4 is included.

A hole portion 6 communicating with the hollow portion 12 is provided in the cover film 5. In the manufacturing process of the surface acoustic wave filter 1, the hole portion 6 is provided to remove a sacrificial layer formed on the piezoelectric substrate 2 in order to form the hollow portion 12 in the cover film 5 after the formation of the hollow portion 12.

The hole portion 6 is covered and sealed by the reinforcing film 7 disposed on the cover film 5. In the example shown in FIG. 5, one hole portion 6 is provided with respect to one hollow portion 12, but a plurality of hole portions 6 may be provided with respect to one hollow portion 12.

As shown in FIG. 5, in the hollow portion 12 in which the series arm resonator 4a is included, the hole portion 6 of the cover film 5 is disposed at a position overlapping the conductive film 8a in a plan view. In the hollow portion 12 in which the parallel arm resonator 4c is included, the hole portion 6 of the cover film 5 is disposed at a position overlapping the conductive film 8c in a plan view.

As shown in FIG. 5, the reinforcing film 7 is disposed on the cover film 5 and covers the cover film 5. The reinforcing film 7 is preferably made of, for example, an insulating material, and an electrically insulating glass film, for example, may be used. A thickness of the reinforcing film 7 is preferably, for example, about 7 μmm. The reinforcing film 7 is able to mechanically reinforce the cover film 5. The reinforcing film 7 is also used to create a flat surface of the entire component. The reinforcing film 7 can maintain mechanical stability of the surface acoustic wave resonator 4, and can form a capsule in which the surface acoustic wave resonator 4 is disposed inside the hollow portion 12.

The cover film 5 and the reinforcing film 7 define an "insulating film". As the insulating film, a resin having high thermal conductivity can be used so that heat generated in the surface acoustic wave resonator 4 and the wiring 3 can be efficiently released to the outside. The cover film 5 corresponds to one preferred embodiment of a "first cover", and the reinforcing film 7 corresponds to one preferred embodiment of a "second cover".

The conductive film 8 is provided on the reinforcing film 7. The conductive film 8 is preferably made of, for example, a metal film such as Cu or Au. As will be described later, the conductive film 8 is provided to electrically connect the bump 9 and the wiring 3. A thickness of the conductive film 8 is preferably, for example, about 10 μm.

As shown in FIG. 5, the conductive film 8 includes a portion that passes through the reinforcing film 7 and the cover film 5 in the thickness direction of the piezoelectric substrate 2. The cover film 5 is provided with through-holes 11a to 11d. As shown in FIG. 4, the through-holes 11a to 11d are disposed at positions overlapping the wirings 3a to 3d, respectively in a plan view. Through the through-holes 11a to 11d, the conductive films 8a to 8d are connected to the wirings 3a to 3d, respectively.

The bump 9 is provided on the conductive film 8. As shown in FIG. 4, the bump 9a is disposed at a position overlapping at least a portion of the series arm resonator 4a when viewed in a plan view. The bump 9b is disposed at a position overlapping at least a portion of the series arm resonator 4b in a plan view. A bump 9c is disposed at a position overlapping at least a portion of the parallel arm resonator 4c in a plan view. A bump 9d is disposed at a position overlapping at least a portion of the parallel arm resonator 4d in a plan view.

The bump 9 corresponds to one preferred embodiment of the "external connection terminal". When the surface acoustic wave filter 1 is mounted in or on the circuit board 20, the bump 9 is connected to the wiring 21 provided on the circuit board 20 (see FIG. 2). The bump 9d can be formed using, for example, solder such as Pb—Sn alloy solder, lead-free solder, Au—Sn alloy solder, or Au—Ge alloy solder. However, the external connection terminal is not limited to a bump, and a thin film may be formed using a conductive material, for example, to form a flat pad. Note that, also in a case where the external connection terminal is a pad, the pad is disposed at a position overlapping at least a portion of the surface acoustic wave resonator in a plan view.

As shown in FIG. 5, the series arm resonators 4a, 4e, and 4b are electrically connected in series between the bump 9a and the bump 9b. In detail, one comb-shaped electrode of the series arm resonator 4a is electrically connected to the bump 9a via the wiring 3a and the conductive film 8a. The bump 9a is electrically connected to the input terminal T1 (see FIG. 1) provided on the circuit board 20 when the surface acoustic wave filter 1 is mounted in or on the circuit board 20.

The other comb-shaped electrode of the series arm resonator 4a is electrically connected to one comb-shaped electrode of the series arm resonator 4e via the wiring 3e. The other electrode of the series arm resonator 4e is electrically connected to one comb-shaped electrode of the series arm resonator 4b via the wiring 3f. The other comb-shaped electrode of the series arm resonator 4b is electrically connected to the bump 9b via the wiring 3b and the conductive film 8b. The bump 9b is electrically connected to an output terminal T2 (see FIG. 1) provided on the circuit board 20 when the surface acoustic wave filter 1 is mounted in or on the circuit board 20.

Further, one comb-shaped electrode of the parallel arm resonator 4c is electrically connected to the wiring 3f via the wiring 3g. The other comb-shaped electrode of the parallel arm resonator 4c is electrically connected to the bump 9c via the wiring 3c and the conductive film 8c. One comb-shaped electrode of the parallel arm resonator 4d is electrically connected to the wiring 3e via the wiring 3h. The other comb-shaped electrode of the parallel arm resonator 4d is electrically connected to the bump 9d via the wiring 3d and the conductive film 8d. Each of the bumps 9c and 9d is electrically connected to a ground wiring GND (see FIG. 1) provided on the circuit board 20 when the surface acoustic wave filter 1 is mounted in or on the circuit board 20.

The sealing material 10 is disposed on the reinforcing film 7. The sealing material 10 may preferably be made of, for example, an insulating material such as an epoxy resin. The sealing material 10 is provided so that the bumps 9a to 9d are exposed. The sealing material 10 preferably has a thickness of, for example, about 1 μm.

Next, with reference to a comparative example shown in FIG. 21, problems of the comparative example and the advantageous operational effects of the surface acoustic wave filter 1 according to the first preferred embodiment will be described.

Figure 21:
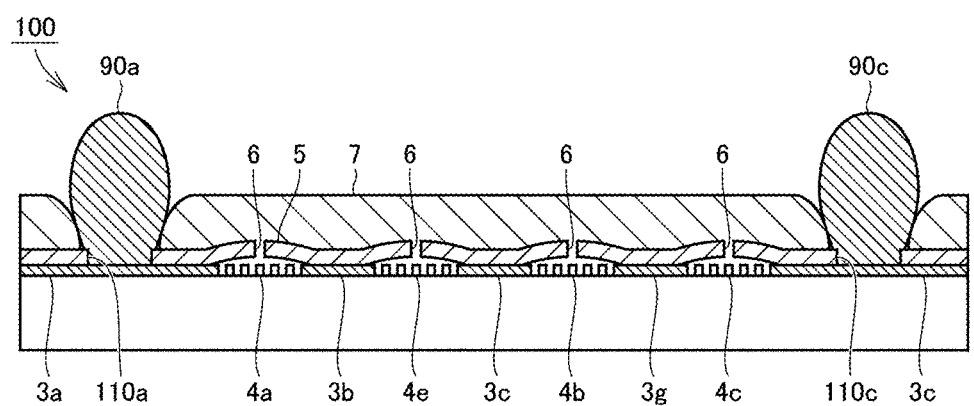
FIG. 21 is a cross-sectional view of a surface acoustic wave filter according to a comparative example.

FIG. 21 is a cross-sectional view of a surface acoustic wave filter 100 according to the comparative example, and is a diagram that is compared with FIG. 5.

Referring to FIG. 21, the surface acoustic wave filter 100 according to the comparative example basically includes the surface acoustic wave resonator 4, the wiring 3, the cover film 5, and the reinforcing film 7 formed on a piezoelectric substrate 2, similarly to the surface acoustic wave filter 1 according to the first preferred embodiment. However, in the comparative example, the conductive film 8 is not provided on the reinforcing film 7.

In this case, the bumps 90a and 90b are not disposed on the conductive film 8, but are connected to the wirings 3a and 3b through through-holes 110a and 110b provided in the cover film 5 and the reinforcing film 7, respectively. In a plan view viewed from the thickness direction of the piezoelectric substrate 2, the bump 90a is disposed at a position overlapping the wiring 3a, and the bump 90b is disposed at a position overlapping the wiring 3c. That is, in a plan view, the bumps 90a and 90b and the surface acoustic wave resonator 4 are arranged side by side.

In the comparative example, in order to prevent a crack due to a rapid temperature change (heat shock) from occurring at a bonding portion between the bump and the wiring, it is necessary to increase the adhesion between the bump and the wiring. Therefore, it is preferable, for example, to secure a large area occupied by the wiring on which the bumps are placed on the main surface 2a of the piezoelectric substrate 2. On the other hand, if the area occupied by the wiring on the main surface 2a of the piezoelectric substrate 2 is increased, the area in which the surface acoustic wave resonator 4 is disposed in the entire main surface 2a is narrowed, which leads to deterioration in performance of the surface acoustic wave filter 1. Therefore, in the electronic component including a plurality of surface acoustic wave resonators 4 as in the surface acoustic wave filter 1, there is a problem that the area of the wiring on which this bump is disposed becomes a bottleneck, thus making it difficult to miniaturize the electronic component.

On the other hand, in order to secure the area in which the surface acoustic wave resonator 4 is disposed, the area of the portion to be bonded to the bump is reduced in the wiring on which the bump is disposed, and when a region of the wiring is reduced, the adhesion between the bump and the wiring is lowered, and as a result, there is a possibility that the heat shock resistivity of the bump may deteriorate.

As described above, in the surface acoustic wave filter 100 according to the comparative example, it is difficult to reduce the size of the electronic component by securing the region of wiring on which the bumps are mounted, and also it is difficult to achieve both the securing of the heat shock resistivity of the bump and the reduction of the size of the electronic component.

In the surface acoustic wave filter 1 according to the first preferred embodiment, the conductive film 8 is provided on the reinforcing film 7, the bump 9 is provided on the conductive film 8, and a portion of the conductive film 8 is connected to the wiring 3. Accordingly, even when the area of the portion to which the conductive film 8 is bonded in the wiring 3 is reduced, the bump 9 having a predetermined size can be provided on the conductive film 8, so that deterioration in heat shock resistivity of the bump can be prevented.

By forming bumps on the conductive film 8, as shown in FIG. 4, the bump 9 can be disposed at positions overlapping the surface acoustic wave resonator 4 when viewed in a plan view. According to this structure, an area of the surface acoustic wave resonator 4 can be made larger in the main surface 2a of the piezoelectric substrate 2 than that in the comparative example. In other words, when securing the area of the surface acoustic wave resonator 4 to be the same as or similar to that of the comparative example, the surface acoustic wave filter 1 can be made compact while securing the heat shock resistivity of the bump 9. As a result, in the surface acoustic wave filter 1 according to the first preferred embodiment, the heat shock resistivity can be secured, and also the electronic component can be made compact.

Manufacturing Method of Surface Acoustic Wave Filter

Next, a non-limiting example of a method of manufacturing the surface acoustic wave filter 1 according to the first preferred embodiment will be described with reference to FIG. 6 to FIG. 15.

Figure 6:
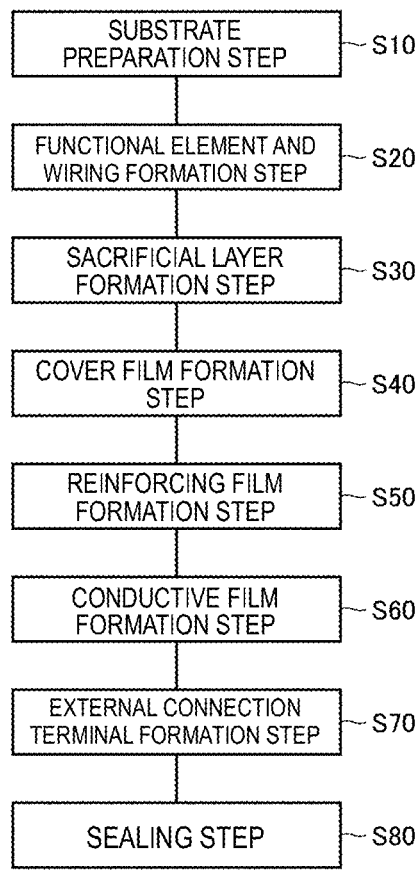
FIG. 6 is a flow chart showing a method of manufacturing a surface acoustic wave filter according to the first preferred embodiment of the present invention.

FIG. 6 is a flow chart showing a method of manufacturing the surface acoustic wave filter 1 according to the first preferred embodiment.

Referring to FIG. 6, firstly, a substrate preparation step (FIG. 6: S10) is performed. For example, the piezoelectric substrate 2 made of a piezoelectric single crystal, such as LiTaO$_3$ or LiNbO$_3$, is prepared.

Figure 7:
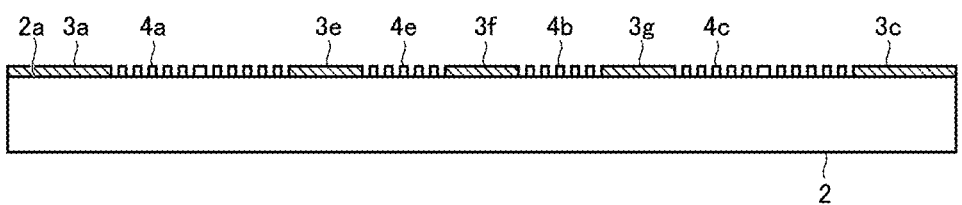
FIG. 7 is a cross-sectional view of the surface acoustic wave filter during manufacture of the surface acoustic wave filter according to the first preferred embodiment of the present invention.
Figure 8:
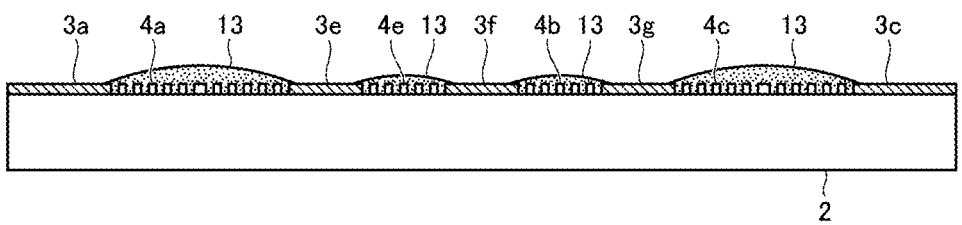
FIG. 8 is a cross-sectional view of the surface acoustic wave filter during manufacture of the surface acoustic wave filter according to the first preferred embodiment of the present invention.
Figure 9:
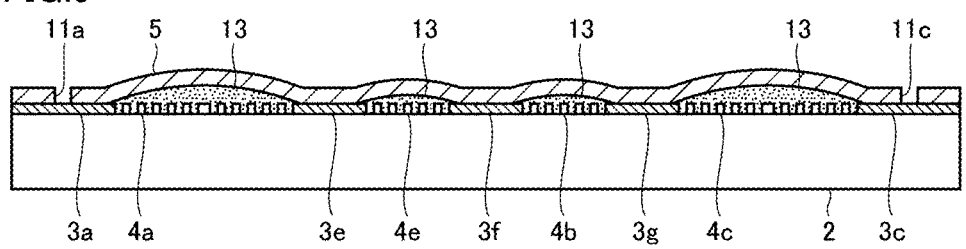
FIG. 9 is a cross-sectional view of the surface acoustic wave filter during manufacture of the surface acoustic wave filter according to the first preferred embodiment of the present invention.

Next, a functional element and a wiring formation step (FIG. 6: S20) is performed. Referring to FIG. 7, a plurality of surface acoustic wave resonators 4a to 4e are formed on the main surface 2a of the piezoelectric substrate 2, for example. Each surface acoustic wave resonator 4 includes an IDT electrode and reflectors disposed on both sides of the IDT electrode in the propagation direction of the surface acoustic wave. In FIG. 7, the cross-sectional shapes of a plurality of electrode fingers of the IDT electrodes of the surface acoustic wave resonators 4a, 4e, and 4c are shown. The plurality of surface acoustic wave resonators 4a to 4e define a ladder filter.

A plurality of wirings 3a to 3f are further formed on the main surface 2a of the piezoelectric substrate 2. As shown in FIG. 4, each of the wirings 3 is connected to the IDT electrode of the surface acoustic wave resonator 4.

The surface acoustic wave resonator 4 and the wiring 3 can be formed by, for example, a thin film formation method such as a sputtering method, a vapor deposition method, a chemical vapor deposition (CVD) method, or the like. Patterning is performed by a photolithography method using a reduced projection exposure apparatus (stepper) and a reactive ion etching (RIE) apparatus to obtain a predetermined shape. The surface acoustic wave resonator 4 and the wiring 3 can be formed of the same or substantially the same material and in the same or substantially the same process.

Next, a sacrificial layer formation step (FIG. 6: S30) is performed. Specifically, with reference to FIG. 8, a sacrificial layer 13 is deposited on the main surface 2a of the piezoelectric substrate 2 and covers the surface acoustic wave resonator 4. The sacrificial layer 13 is preferably made of, for example, an organic resist.

Next, a cover film formation step (FIG. 6: S40) is performed. Specifically, with reference to FIG. 9, the cover film 5 covers the sacrificial layer 13 and the wiring 3. The cover film 5 can be formed by the thin film formation method such as the CVD method or the vapor deposition method, for example. At this time, a portion of the cover film 5 is removed by the photolithography method so that at least a portion of each of the wirings 3a to 3d is exposed. Accordingly, the through-holes 11a to 11d are formed in the cover film 5.

Figure 10:
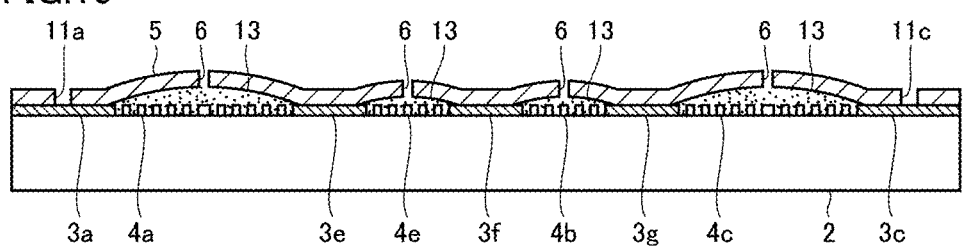
FIG. 10 is a cross-sectional view of the surface acoustic wave filter during manufacture of the surface acoustic wave filter according to the first preferred embodiment of the present invention.

Next, referring to FIG. 10, in the cover film 5, the hole portion 6 is formed by opening a position overlapping each surface acoustic wave resonator 4 when viewed in a plan view. In the example shown in FIG. 10, one hole portion 6 is formed in one surface acoustic wave resonator 4, but a plurality of hole portions 6 may be formed.

Figure 11:
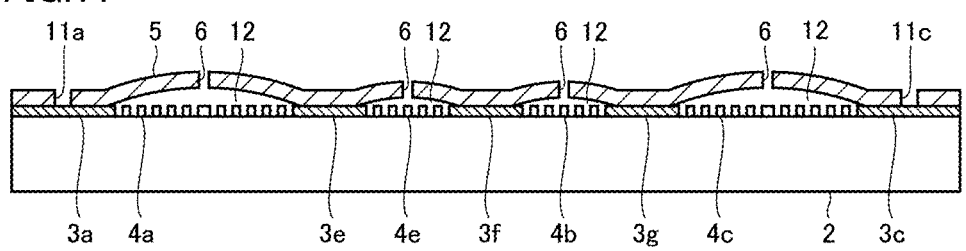
FIG. 11 is a cross-sectional view of the surface acoustic wave filter during manufacture of the surface acoustic wave filter according to the first preferred embodiment of the present invention.
Figure 12:
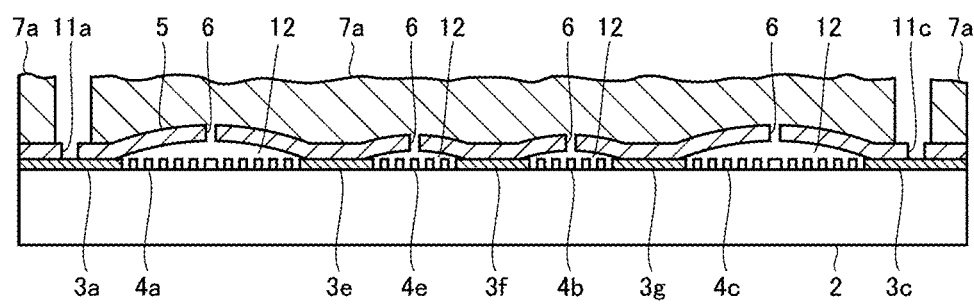
FIG. 12 is a cross-sectional view of the surface acoustic wave filter during manufacture of the surface acoustic wave filter according to the first preferred embodiment of the present invention.

Next, the sacrificial layer 13 is ashed. For example, the sacrificial layer 13 is preferably removed by dry ashing using molecular or atomic oxygen, ozone or oxygen plasma. As a result, as shown in FIG. 11, the hollow portion 12 is formed.

Next, a reinforcing film formation step (FIG. 6: S50) is performed. Specifically, with reference to FIG. 12, a glass paste 7a is applied to the cover film 5. In the glass paste 7a, a glass frit dispersed in a binder matrix can be used. For example, by applying the glass paste 7a by using a doctor blade, the surface of the glass paste 7a can be controlled to be flat. The glass paste 7a is applied so as not to close the through-holes 11a to 11d.

Figure 13:
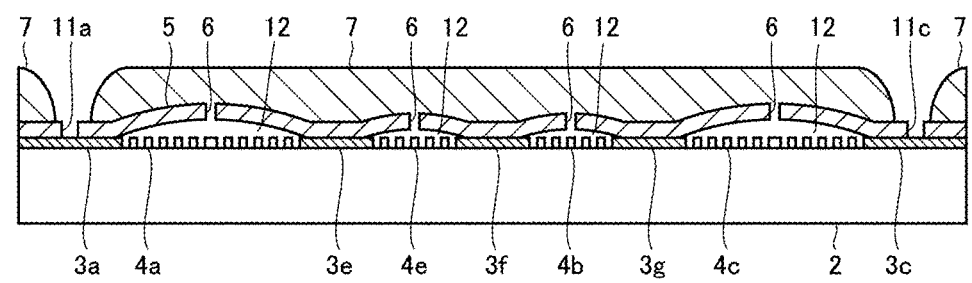
FIG. 13 is a cross-sectional view of the surface acoustic wave filter during manufacture of the surface acoustic wave filter according to the first preferred embodiment. of the present invention
Figure 14:
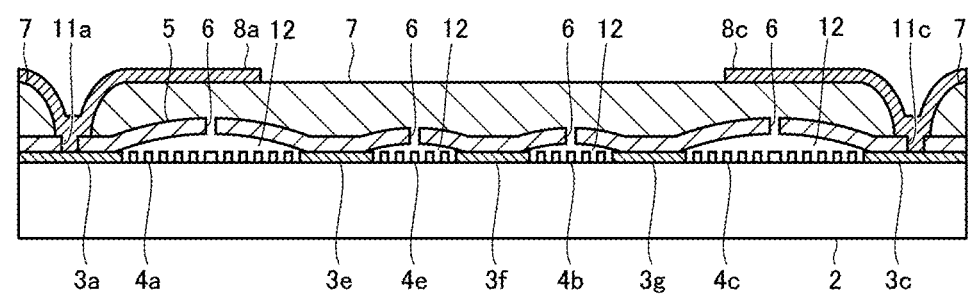
FIG. 14 is a cross-sectional view of the surface acoustic wave filter during manufacture of the surface acoustic wave filter according to the first preferred embodiment of the present invention.

Next, the glass paste 7a is heated to form a reinforcing film 7 made of glass, as shown in FIG. 13. The binder can be decomposed in H$_2$O and/or CO$_2$ atmosphere when the glass paste is heated.

The composition of the glass paste is preferably selected, for example, so that the glass which is produced when the glass paste is heated covers the hole portion 6 of the cover film 5 and does not infiltrate into the hollow portion 12. The glass may at least partially fill the hole portion 6.

Next, a conductive film formation step (FIG. 6: S60) is performed. More specifically, with reference to FIG. 14, the conductive film 8 is formed on the reinforcing film 7. The conductive film 8 can be formed by, for example, the thin film formation method such as the sputtering method, the vapor deposition method, or the CVD method.

The conductive film 8 is formed at a position overlapping at least a portion of the surface acoustic wave resonator 4 connected to the through-hole 11 and the wiring 3 on which the through-hole 11 is located, in a plan view. Through the through-holes 11a to 11d, the conductive films 8a to 8d are connected to the wirings 3a to 3d, respectively.

More preferably, the conductive film 8 is formed in a position overlapping the hole portion 6 provided in the cover film 5 covering the surface acoustic wave resonator 4 connected to the wiring 3 on which the through-hole 11 is located, in a plan view.

Figure 15:
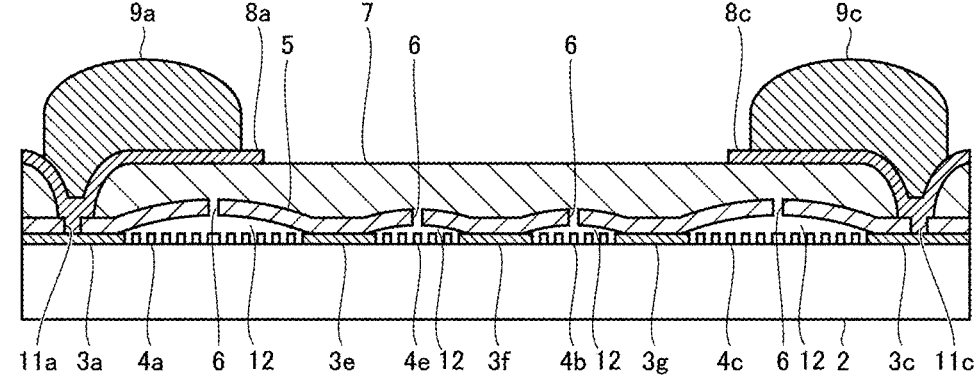
FIG. 15 is a cross-sectional view of the surface acoustic wave filter during manufacture of the surface acoustic wave filter according to the first preferred embodiment of the present invention.

Next, an external connection terminal formation step (FIG. 6: S70) is performed. Referring to FIG. 15, the bumps 9a to 9d made of solder are formed on the surfaces of the conductive films 8a to 8d, respectively.

Next, a sealing step (FIG. 6: S80) is performed. Specifically, a thermosetting resin such as an epoxy resin is supplied between the bumps 9a to 9d by printing or the like. By heating the thermosetting resin, the surface acoustic wave filter 1 shown in FIG. 2 to FIG. 5 is formed.

Second Preferred Embodiment

As the size of an electronic component is reduced, a plurality of functional elements are densely arranged on a piezoelectric substrate. Further, wiring connecting the functional elements to each other is also thinned, and the shape thereof becomes complicated. As a result, the amount of heat generated in electronic components tends to increase as the size of each of the electronic components is reduced. In order to significantly reduce or prevent the variation in the characteristics of the electronic component due to heat generation, high heat dissipation performance is preferable.

In the second preferred embodiment of the present invention, an electronic component having significantly improved heat dissipation performance will be described. In the second preferred embodiment, a surface acoustic wave filter is exemplified as a preferred embodiment of an electronic component similar to the first preferred embodiment.

Circuitry of the surface acoustic wave filter according to the second preferred embodiment is the same as or similar to the circuitry shown in FIG. 1. The structure of the surface acoustic wave filter according to the second preferred embodiment is the same as or similar to the surface acoustic wave filter 1 according to the first preferred embodiment except for the conductive film 8 and the bump 9. In FIG. 16 to FIG. 20 will be shown below, the same reference signs are given to portions common to those in FIG. 1 to FIG. 5 described above, and a detailed description of the common portions will not be repeated.

Figure 16:
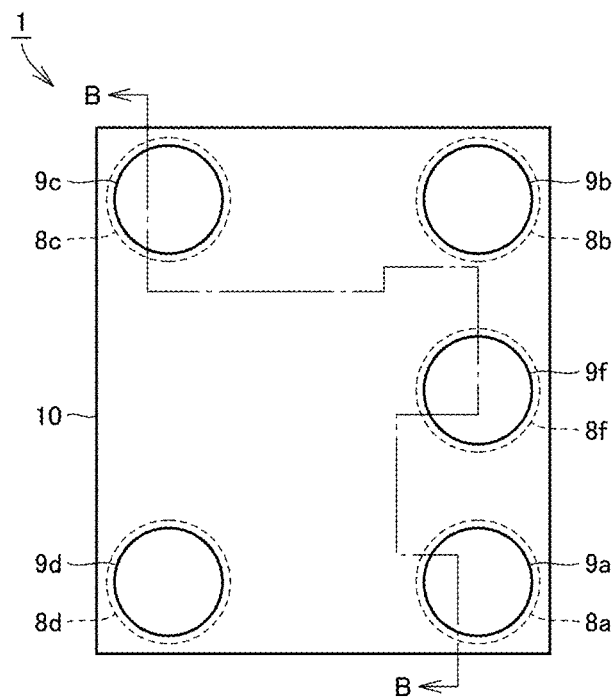
FIG. 16 is a plan view of a surface acoustic wave filter according to a second preferred embodiment of the present invention.
Figure 17:
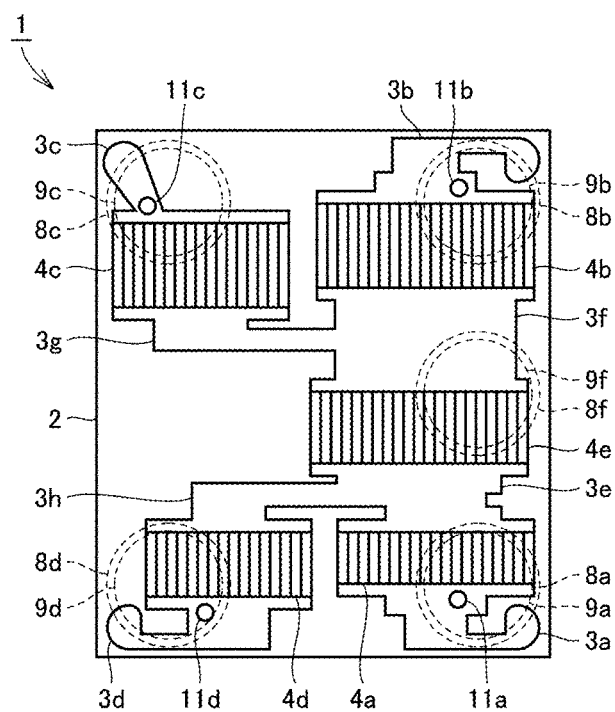
FIG. 17 is a perspective plan view of the surface acoustic wave filter shown in FIG. 16.
Figure 18:
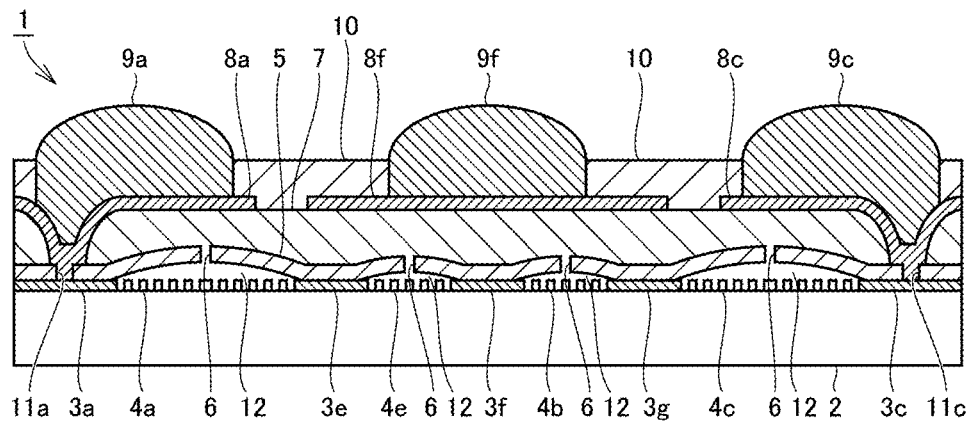
FIG. 18 is a cross-sectional view corresponding to a portion along a line B-B in FIG. 16.

FIG. 16 is a plan view of the surface acoustic wave filter 1 according to the second preferred embodiment. FIG. 17 is a perspective plan view of the surface acoustic wave filter 1 shown in FIG. 16. The surface acoustic wave resonators 4a to 4e and the wirings 3a to 3f incorporated in the surface acoustic wave filter 1 are covered with the sealing material 10 and an insulating film, but FIG. 16 shows an internal structure by seeing through the sealing material 10 and the insulating film for convenience of explanation. FIG. 18 is a cross-sectional view corresponding to a portion along a line B-B in FIG. 16.

Referring to FIG. 16 to FIG. 18, the surface acoustic wave filter 1 according to the second preferred embodiment is obtained by adding a conductive film 8f and a bump 9f to the surface acoustic wave filter 1 according to the first preferred embodiment.

As shown in FIG. 18, the conductive film 8f is provided on the reinforcing film 7, as is the case with the conductive films 8a to 8d. However, the conductive film 8f is different from the conductive films 8a to 8d in that the conductive film 8f does not include a portion passing through the reinforcing film 7 and the cover film 5 and is electrically isolated from the wiring 3.

The bump 9f is provided on the conductive film 8f. Since the conductive film 8f is electrically isolated from the wiring 3, the bump 9f is also electrically isolated from the wiring 3.

As shown in FIG. 17, the conductive film 8f is located at a position overlapping at least a portion of the wirings 3e, 3f, and 3g in a plan view. The bump 9f is located at a position overlapping at least a portion of the wiring 3f in a plan view.

Here, as shown in the circuitry of FIG. 1, the wiring 3e is a wiring that connects the series arm resonator 4a and the series arm resonator 4e, and the wiring 3f is a wiring that connects the series arm resonator 4e and the series arm resonator 4b. The wirings 3e and 3f are wirings that are not electrically connected to the bump 9, unlike the wirings 3a to 3d. If any one of the wirings 3e and 3f is electrically connected to the bump 9, the wiring is electrically connected to the wiring 21 (see FIG. 2) on the circuit board 20, so that the transmission characteristic of the surface acoustic wave filter 1 is changed from a design value.

In the following description, wirings 3e and 3f that connects between two surface acoustic wave resonators 4 are referred to as "inter-terminal wiring", and wirings 3a to 3d that electrically connects the surface acoustic wave resonator 4 and the bump 9 are also referred to as "external connection wiring".

The external connection wiring can release heat generated by the surface acoustic wave resonator 4 and heat generated by the external connection wiring itself to the outside through the conductive film 8 and the bump 9. On the other hand, the inter-terminal wiring transfers heat generated by the surface acoustic wave resonator 4 and the inter-terminal wiring itself to the external connection wiring through the piezoelectric substrate 2 and dissipates the heat from the external connection wiring to the outside through the conductive film 8 and the bump 9. Therefore, in the inter-terminal wiring, a heat dissipation path is relatively longer than that in the external connection wiring inevitably, so that the heat resistance of the heat dissipation path tends to be high. As a result, heat dissipation performance of the inter-terminal wiring and the surface acoustic wave resonator 4 connected to the inter-terminal wiring may deteriorate, which may cause variation in characteristics of the surface acoustic wave filter 1.

In the surface acoustic wave filter 1 according to the second preferred embodiment, the bump 9 is located at a position overlapping at least a portion of the inter-terminal wiring in a plan view. However, electrical insulation between the bump 9 and the inter-terminal wiring is ensured by the insulating film provided by the cover film 5 and the reinforcing film 7.

In this way, the inter-terminal wiring can transfer heat to the bump 9 through the cover film 5, the reinforcing film 7, and the conductive film 8, and can dissipate heat to the outside from the bump 9. That is, heat can be transferred to the bump 9 without passing through the piezoelectric substrate 2 and the external connection wiring, so that the heat dissipation path of the inter-terminal wiring can be shortened, and the thermal resistance of the heat dissipation path can be reduced. As a result, it is possible to significantly improve the heat dissipation performance of the inter-terminal wiring and the surface acoustic wave resonator 4 connected thereto.

Furthermore, in the surface acoustic wave filter 1 according to the second preferred embodiment, the conductive film 8 is located at a position overlapping the hole portion 6 of the cover film 5 in a plan view. Accordingly, as shown in FIG. 18, the hole portion 6 can be covered with the reinforcing film 7 and the conductive film 8.

In the comparative example shown in FIG. 21, the hole portion 6 is covered with only the reinforcing film 7. Therefore, the reinforcing film 7 absorbs moisture from the atmosphere or the like, and the moisture enters the hollow portion 12 through the hole portion 6, so that dielectric breakdown may possibly occur in the surface acoustic wave resonator 4.

In the second preferred embodiment, since the hole portion 6 is covered with the conductive film 8 that does not absorb moisture, infiltration of moisture into the hollow portion 12 can be prevented. Therefore, it is possible to significantly improve moisture resistivity of the surface acoustic wave filter 1.

By being connected to any conductive film of the conductive films 8a to 8d, the conductive film 8f may be substantially integrated with the conductive film. However, connecting the conductive film 8f to two or more conductive films of the conductive films 8a to 8d cannot be made since the two or more conductive films are electrically short-circuited to each other.

Manufacturing Method of Surface Acoustic Wave Filter

Next, a non-limiting example of a method of manufacturing the surface acoustic wave filter 1 according to the second preferred embodiment will be described. The surface acoustic wave filter 1 according to the second preferred embodiment can be manufactured by executing the flow chart of FIG. 6. However, processing in the conductive film formation step (FIG. 6: S60) and the external connection terminal formation step (FIG. 6: S70) is different from that in the surface acoustic wave filter 1 according to the first preferred embodiment.

Figure 19:
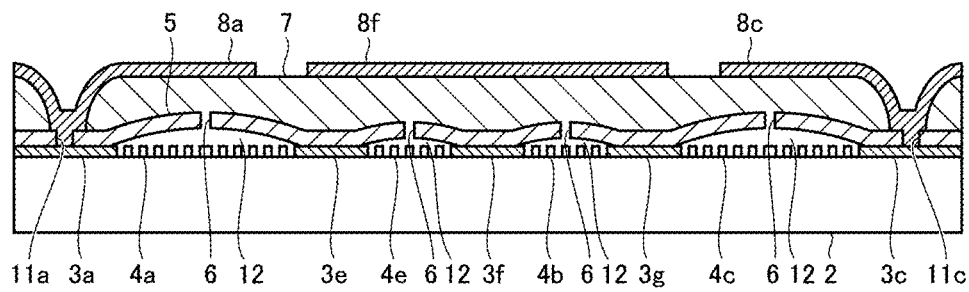
FIG. 19 is a cross-sectional view of the surface acoustic wave filter during manufacture of the surface acoustic wave filter according to the second preferred embodiment of the present invention.

In the conductive film formation step (FIG. 6: S60), as shown in FIG. 19, the conductive film 8f is further formed on the reinforcing film 7. The conductive film 8f is formed at a position overlapping at least a portion of the wirings 3e and 3f that are inter-terminal wirings in a plan view. The conductive film 8f may be formed by the same or substantially the same process and the same or substantially the same material as the conductive films 8a to 8d.

More preferably, the conductive film 8f is formed at a position overlapping the hole portion 6 provided in the cover film 5 covering the surface acoustic wave resonator 4 connected to the wiring 3f in a plan view.

Figure 20:
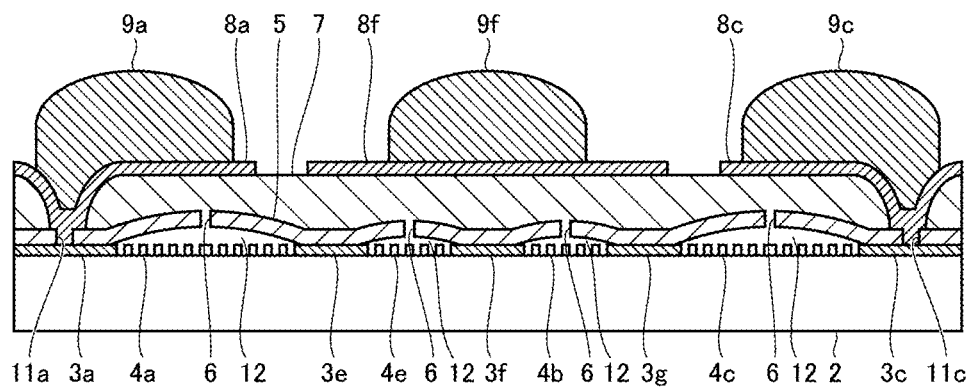
FIG. 20 is a cross-sectional view of the surface acoustic wave filter during manufacture of the surface acoustic wave filter according to the second preferred embodiment of the present invention.

In the external connection terminal formation step (FIG. 6: S70), as shown in FIG. 20, the bump 9f is further formed on the surface of the conductive film 8f. The bump 9f is formed at a position overlapping at least a portion of the wiring 3f in a plan view. The bump 9f may be formed by the same or substantially the same process and the same or substantially the same material as that of the bumps 9a to 9d.

The preferred embodiments of the present invention are intended to be illustrative only and not restrictive. The scope of the invention is indicated by the appended claims rather than by the foregoing description, and it is intended that all changes within the meaning and range equivalent to the scope of the appended claims be embraced therein.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a piezoelectric substrate;
   a first functional element provided on the piezoelectric substrate;
   a first wiring provided on the piezoelectric substrate and electrically connected to the first functional element;
   an insulating film provided on the piezoelectric substrate and defining a first hollow portion in which the first functional element is disposed;
   a first conductive film provided on the insulating film and including a portion that passes through the insulating film and is electrically connected to the first wiring; and
   a first external connection terminal provided on the first conductive film and located at a position overlapping at least a portion of the first functional element in a plan view as viewed from a thickness direction of the piezoelectric substrate; wherein
   the first external connection terminal is in direct contact with the first conductive film.

2. The electronic component according to claim 1, wherein
   a first hole portion opened toward the first hollow portion is provided in the insulating film; and
   the first conductive film is located at a position overlapping the first hole portion in the plan view.

3. The electronic component according to claim 2, wherein
   the insulating film includes:
      a first cover defining the first hollow portion; and
      a second cover covering the first cover; and
   the first hole portion is provided in the first cover, and is located at a position overlapping the second cover and the first conductive film in the plan view.

4. The electronic component according to claim 3, wherein the first hole portion is covered and sealed by the second cover.

5. The electronic component according to claim 1, further comprising:
   a second functional element provided on the piezoelectric substrate and electrically connected in series with the first functional element; and
   a second wiring provided on the piezoelectric substrate and connected between the first functional element and the second functional element; wherein
   the insulating film further defines a second hollow portion in which the second functional element is included; and
   the electronic component further includes:
      a second conductive film provided on the insulating film and electrically isolated from the second wiring; and
      a second external connection terminal provided on the second conductive film and located at a position overlapping at least a portion of the second wiring in the plan view.

6. The electronic component according to claim 5, wherein
   the insulating film includes first and second hole portions that open toward the first and second hollow portions, respectively;

the first conductive film is located at a position overlapping the first hole portion in the plan view; and the second conductive film is located at a position overlapping the second hole portion in the plan view.

7. The electronic component according to claim 6, wherein the insulating film includes:
   a first cover defining the first and second hollow portions; and
   a second cover covering the first cover;

the first hole portion is provided in the first cover, and is located at a position overlapping the second cover and the first conductive film in the plan view; and the second hole portion is provided in the first cover, and is located at a position overlapping the second cover and the second conductive film in the plan view.

8. The electronic component according to claim 5, wherein the second conductive film is located at a position overlapping at least a portion of the second wiring and the second functional element in the plan view.

9. The electronic component according to claim 5, wherein at least one of the first functional element and the second functional element is a surface acoustic wave resonator.

10. The electronic component according to claim 5, wherein the first functional element and the second functional element are included in a plurality of surface acoustic wave resonators that are connected to each other in a ladder topology.

11. A module comprising:
   a circuit board including a wiring provided on at least a surface of the circuit board; and
   the electronic component according to claim 1; wherein
   the electronic component is flip-chip mounted on the circuit board.

12. The module according to claim 11, further comprising:
   a sealing material provided on the circuit board; wherein
   the sealing material seals the electronic component.

13. The module according to claim 12, wherein the sealing material covers the first functional element and the first wiring.

14. The electronic component according to claim 1, wherein the first functional element is a surface acoustic wave resonator.

15. The electronic component according to claim 1, wherein the insulating film has a same or substantially a same shape as a main surface of the piezoelectric substrate.

16. The electronic component according to claim 1, wherein the conductive film electrically connects the first external connection terminal and the first wiring.

* * * * *